(12) United States Patent
Nagatomo et al.

(10) Patent No.: US 8,265,114 B2
(45) Date of Patent: Sep. 11, 2012

(54) SURFACE EMITTING LASER

(75) Inventors: Yasuhiro Nagatomo, Kawasaki (JP); Takeshi Uchida, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/124,865

(22) PCT Filed: Mar. 18, 2010

(86) PCT No.: PCT/JP2010/055299
§ 371 (c)(1),
(2), (4) Date: Apr. 19, 2011

(87) PCT Pub. No.: WO2010/113774
PCT Pub. Date: Oct. 7, 2010

(65) Prior Publication Data
US 2011/0216796 A1  Sep. 8, 2011

(30) Foreign Application Priority Data

Apr. 2, 2009 (JP) ................................. 2009-090208

(51) Int. Cl.
*H01S 5/00* (2006.01)
(52) U.S. Cl. .................................................. 372/45.01
(58) Field of Classification Search ............... 372/45.01
See application file for complete search history.

(56) References Cited

U.S. PATENT DOCUMENTS

| | | | | |
|---|---|---|---|---|
| 7,295,745 B2 | 11/2007 | Uchida | ........................ | 385/129 |
| 7,499,480 B2 | 3/2009 | Nagatomo | ............... | 372/50.124 |
| 7,535,946 B2 | 5/2009 | Nagatomo et al. | ........ | 372/50.124 |
| 7,539,226 B2 | 5/2009 | Uchida | ....................... | 372/43.01 |
| 7,680,168 B2 | 3/2010 | Uchida | ....................... | 372/43.01 |
| 7,688,875 B2 | 3/2010 | Uchida | ....................... | 372/50.12 |
| 7,796,662 B2 | 9/2010 | Uchida et al. | ............ | 372/46.013 |
| 7,796,666 B2 | 9/2010 | Nagatomo | ............... | 372/50.124 |
| 7,796,668 B2 | 9/2010 | Hori et al. | ................. | 372/50.124 |
| 7,807,485 B2 | 10/2010 | Uchida et al. | .................. | 438/29 |
| 7,839,912 B2 | 11/2010 | Uchida | .................... | 372/50.124 |
| 7,839,913 B2 | 11/2010 | Uchida et al. | ............ | 372/50.124 |
| 7,842,530 B2 | 11/2010 | Uchida | ........................... | 438/39 |
| 7,869,483 B2 | 1/2011 | Uchida | ........................... | 372/99 |
| 2002/0146196 A1* | 10/2002 | Shirane et al. | .................. | 385/16 |
| 2004/0247009 A1* | 12/2004 | Noda et al. | ...................... | 372/99 |
| 2006/0194359 A1 | 8/2006 | Weisbuch et al. | ............... | 438/35 |
| 2007/0217463 A1* | 9/2007 | Albrecht et al. | ......... | 372/46.012 |
| 2009/0074026 A1 | 3/2009 | Nagatomo et al. | ........ | 372/50.124 |
| 2009/0225805 A1 | 9/2009 | Nagatomo | ....................... | 372/99 |
| 2011/0134941 A1 | 6/2011 | Hoshino et al. | .................... | 372/7 |
| 2011/0134956 A1 | 6/2011 | Nagatomo et al. | ......... | 372/50.11 |

FOREIGN PATENT DOCUMENTS

| | | |
|---|---|---|
| JP | 06-252504 A | 9/1994 |
| JP | 2000-332351 A | 11/2000 |
| JP | 2003-273460 A | 9/2003 |
| WO | WO 2009/036728 A1 | 3/2009 |

* cited by examiner

*Primary Examiner* — Patrick Stafford
(74) *Attorney, Agent, or Firm* — Fitzpatrick, Cella, Harper & Scinto

(57) ABSTRACT

A surface emitting laser having a laminated structure has a first region and a second region. The first region is a region having at least one guided mode, a propagation mode in which light is propagated in the in-plane direction of a substrate at a laser oscillation wavelength. The second region is a region having a substrate radiation mode in which light is emitted to the side of the substrate at the laser oscillation wavelength.

7 Claims, 6 Drawing Sheets

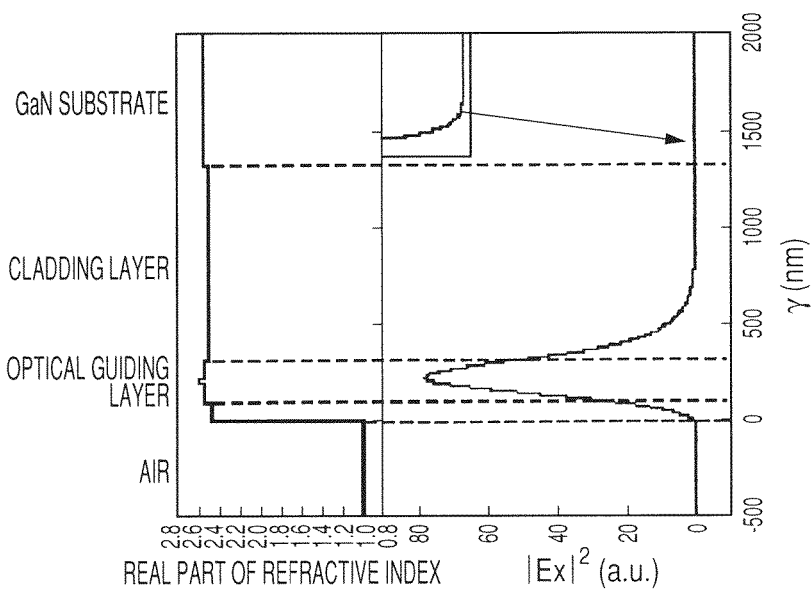
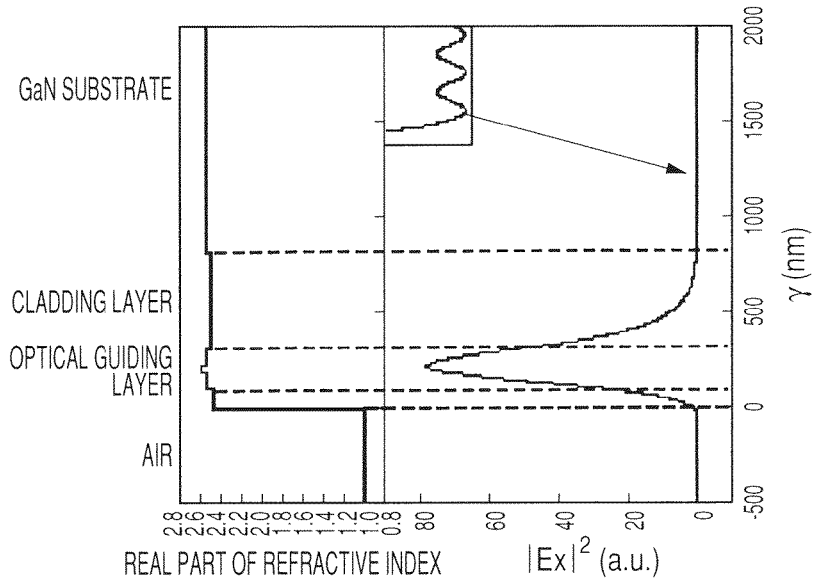
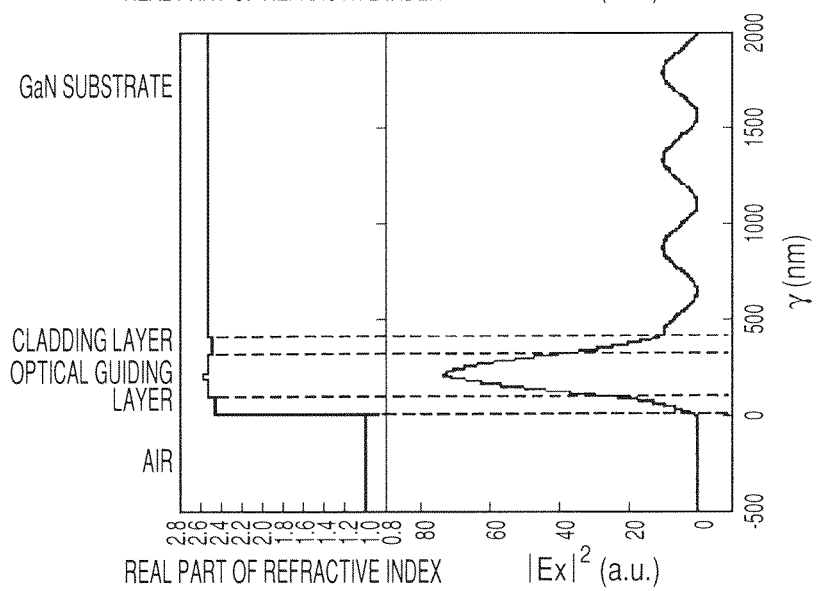

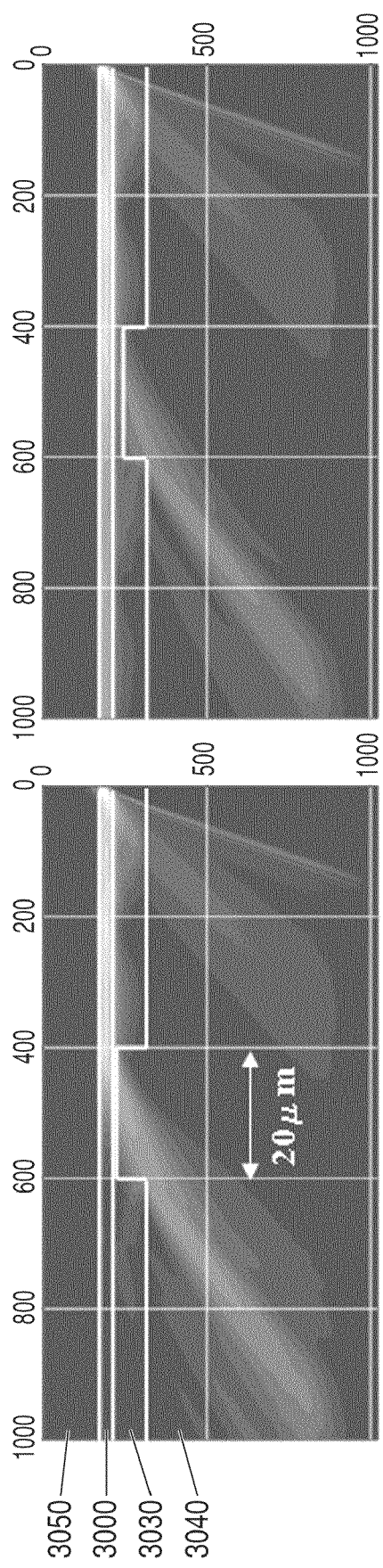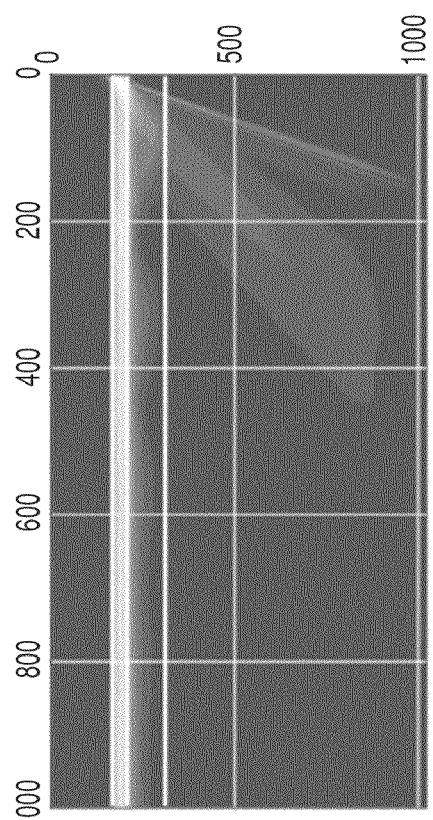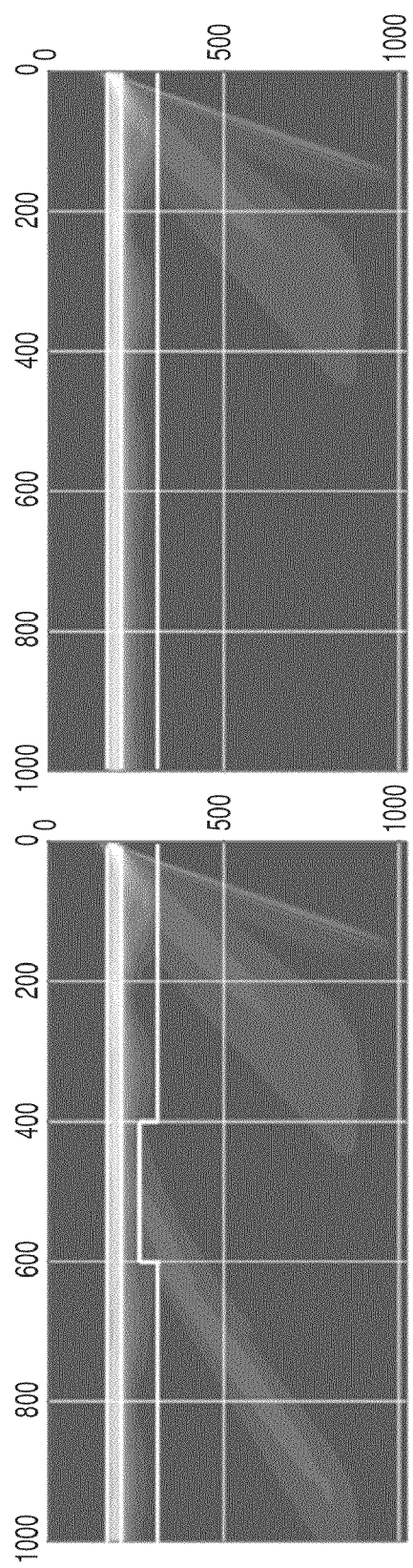
FIG. 3A  FIG. 3B  FIG. 3C  FIG. 3D

SURFACE EMITTING LASER

TECHNICAL FIELD

The present invention relates to a surface emitting laser, and particularly to a surface emitting laser suitable for two-dimensional array arrangement.

BACKGROUND ART

In recent years, many examples where a photonic crystal is applied to semiconductor lasers have been reported. Japanese Patent Application Laid-Open No. 2000-332351 describes a surface emitting laser light source in which an active layer containing a luminescent material is provided, and a two-dimensional photonic crystal is formed in the vicinity of the active layer. This is a sort of distributed feedback (DFB) laser. In this two-dimensional photonic crystal, cylindrical holes are periodically provided in a semiconductor layer, and so the refractive index distribution of the photonic crystal has two-dimensional periodicity.

Light generated in the active layer resonates due to this periodicity to form a standing wave to generate laser oscillation. In addition, the light is extracted in a direction perpendicular to the plane by primary diffraction to operate as a surface emitting laser.

In the above-described two-dimensional photonic crystal surface emitting laser, the resonated direction of the light is an in-plane direction, so that a part of the light leaks from the two-dimensional photonic crystal to the in-plane direction. Therefore, when laser devices are arranged in an array, crosstalk occurs between adjoining lasers.

Japanese Patent Application Laid-Open No. 2003-273460 discloses a structure for inhibiting the occurrence of such crosstalk.

In Japanese Patent Application Laid-Open No. 2003-273460, laser devices are arranged in a direction different from the light traveling direction in which the light travels (direction of the Poynting's vector), whereby crosstalk between adjoining lasers can be lessened.

According to this structure, however, while crosstalk in one certain direction can be lessened, but crosstalk in a direction perpendicular thereto cannot be lessened. Therefore, the structure is not suitable for such arrangement that the many laser devices that are two-dimensionally arranged.

On the other hand, when a reflection structure 10000 is provided between laser devices as illustrated in, for example, FIG. 6, crosstalk can be reduced, but return light 10020 occurs. In general, the return light affects the resonance mode of a DFB laser to make laser characteristics unstable.

A structure suitable for two-dimensional arrangement capable of reducing both crosstalk and return light at the same time has not yet been proposed.

DISCLOSURE OF THE INVENTION

In view of the above-described problems, it is an object of the present invention to provide a surface emitting laser that reduces both crosstalk and return light at the same time and is suitable for two-dimensional array arrangement.

The present invention thus provides a surface emitting laser having a laminated structure in which on a substrate a two-dimensional photonic crystal having a resonance mode in an in-plane direction of the substrate, an optical waveguiding layer and a cladding layer for light confinement provided between the optical waveguiding layer and the substrate are laminated, wherein the laminated structure comprises a first region having at least one guided mode as a propagation mode in which light is propagated in the in-plane direction at a laser oscillation wavelength and a second region having a substrate radiation mode in which light is emitted to the side of the substrate at the laser oscillation wavelength, and the first region comprises the two-dimensional photonic crystal.

According to the present invention, there can be provided a surface emitting laser that reduces both crosstalk and return light at the same time and is suitable for two-dimensional array arrangement.

Further features of the present invention will become apparent from the following description of exemplary embodiments with reference to the attached drawings.

BRIEF DESCRIPTION OF THE DRAWINGS

FIGS. 2A, 2B and 2C are graphs each illustrating a light intensity distribution in an embodiment of the present invention.

FIGS. 3A, 3B, 3C and 3D each illustrate a light propagation condition in an embodiment of the present invention.

BEST MODE FOR CARRYING OUT THE INVENTION

The present invention will hereinafter be described by reference to preferred embodiments thereof.

Figure 1:
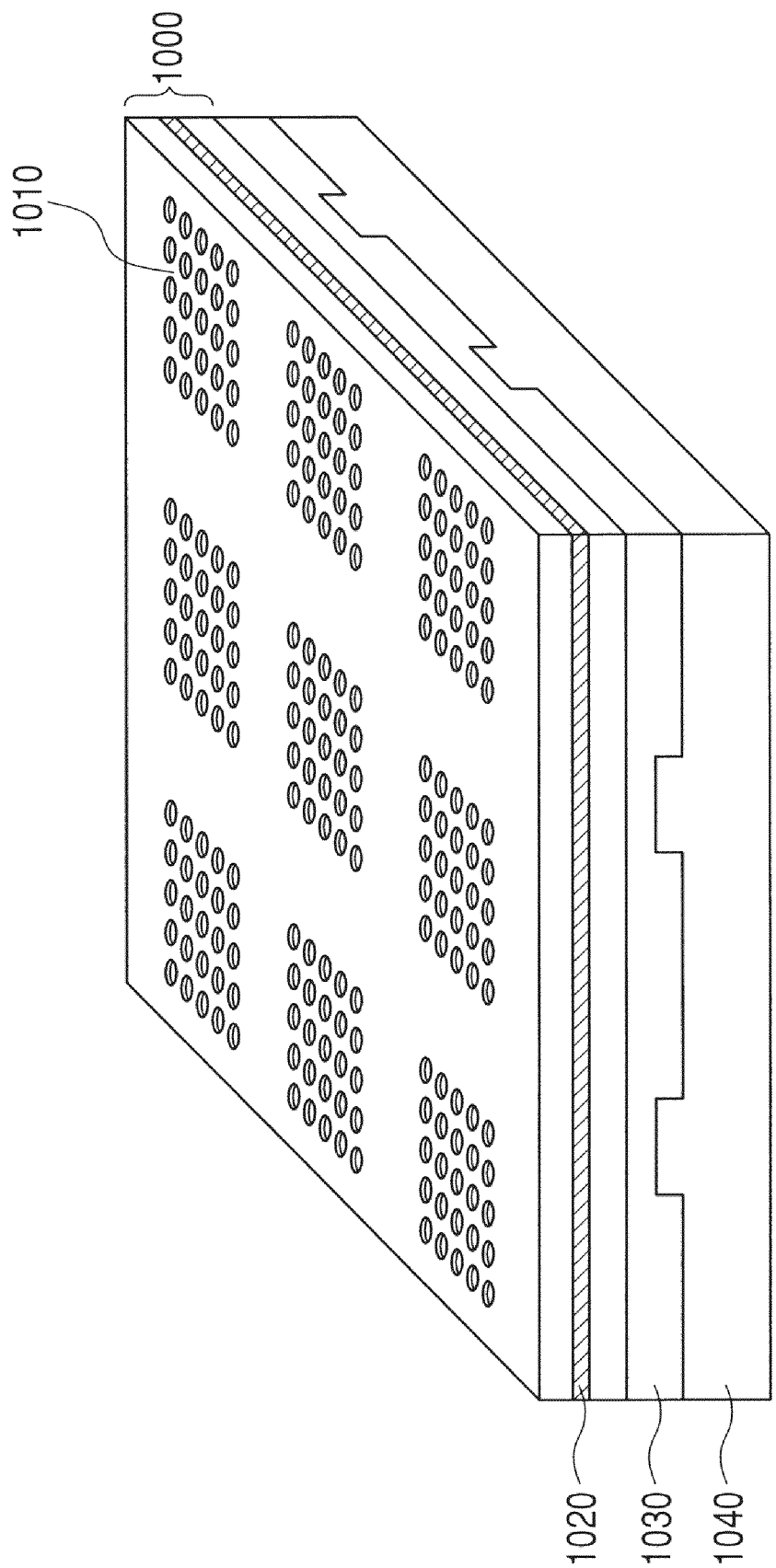
FIG. 1 illustrates a surface emitting laser according to an embodiment of the present invention.

FIG. 1 shows a surface emitting laser to which the constitution of the present invention is applied, which has a laminated structure including a substrate on which a two-dimensional photonic crystal having a resonance mode in the in-plane direction of the substrate, an optical waveguiding layer and a cladding layer are laminated. Incidentally, in the present description, the side of a substrate of a laser device and the side opposite to the substrate are referred to as a "lower" side and an "upper" side, respectively.

As illustrated in FIG. 1, an optical waveguiding layer 1000 in this embodiment is constructed so as to contain an active layer 1020 and is generally designed in such a manner that a peak of a light intensity distribution lies on the active layer.

In the optical waveguiding layer 1000, the two-dimensional photonic crystal is provided on at least one side of the active layer 1020.

The two-dimensional photonic crystal 1010 is formed by periodically arranging, in a plate-like base material, regions different in refractive index from the base material.

The active layer 1020 and the two-dimensional photonic crystal 1010 may be in contact with each other, or a spacer layer may be interposed between them.

As the lattice form of the photonic crystal, may be used a square lattice, triangle lattice or honeycomb lattice.

The lattice constant of the photonic crystal 1010 is determined in consideration of a laser oscillation wavelength and a refractive index of a material. The form of each lattice point is a circle, triangle, square or hexagon.

In this embodiment, the thickness of the cladding layer 1030 is not constant, and it is so constituted as to include two thicknesses of a relatively thick portion and a relatively thin portion.

Here, the relatively thick portion and the relatively thin portion of the cladding layer are called a first region and a second region, respectively. The two-dimensional photonic crystal 1010 is provided on the first region, and the second region is formed so as to surround the first region.

The reason why the cladding layer is so constructed as to vary the thickness thereof in such a manner will hereinafter be described.

In the region of the two-dimensional photonic crystal 1010, it is necessary to confine light in the optical waveguiding layer for generating laser oscillation, and so the thickness of the cladding layer needs to be made sufficiently great so as not to leak the light to the substrate side.

On the other hand, in another region than the two-dimensional photonic crystal 1010, it is necessary for light leaked in the in-plane direction not to reach an adjoining photonic crystal, in order to reduce crosstalk.

It is also necessary for the light leaked in the in-plane direction not to return to each laser device by reflection, in order to avoid influence by the return light.

It is desired that the thickness of the cladding layer is thinned to cause the light to escape on the substrate side, in order to reconcile them.

The thickness of the cladding layer which is required for confining the light in the optical waveguiding layer or allowing the light to escape to the substrate side is determined by calculation taking the wavelength of the light, the thickness of the waveguiding layer and the refractive index of the cladding layer into consideration.

FIGS. 2A to 2C diagrammatically illustrate calculated results of the dependency of a light intensity distribution on the thickness of a cladding layer in the same structure as in FIG. 1.

The structural features except the thickness of the cladding layer are all the same. The transfer matrix method was used for the calculation. FIGS. 2A, 2B and 2C illustrate the calculated results in the case of a cladding layer 100 nm thick, a cladding layer 500 nm thick and a cladding layer 1,000 nm thick, respectively. In FIG. 2A, light greatly leak to the substrate side because the thickness of the cladding layer is too thin.

Incidentally, the component waving on the substrate side in the graph corresponds to the light leaked to the substrate side.

In FIG. 2B, the light seems not to leak to the substrate side at first view. However, when the graph is enlarged, it is confirmed that the light does leak slightly.

In FIG. 2C, the light scarcely leaks on the substrate side because the cladding layer is sufficiently thick. Here, as for a propagation mode in which the light is propagated in the in-plane direction parallel to the substrate, a mode in which the light is waveguided while being strongly confined in the optical waveguiding layer and is not emitted to the substrate side like FIG. 2C is defined as a "guided mode".

In addition, a mode in which the light is emitted to the substrate side like FIG. 2A and FIG. 2B is defined as a "substrate radiation mode".

Both FIG. 2A and FIG. 2B are substrate radiation modes, but are different in the quantity of light leaked to the substrate side. This relates to the propagation length required for causing the light to escape to the substrate side completely.

FIGS. 3A to 3D each illustrate a light propagation condition obtained by calculation using the propagation method. An optical waveguiding layer, a cladding layer, a substrate and air are indicated by reference numerals of 3000, 3030, 3040 and 3050, respectively. FIGS. 3A to 3D illustrate light propagation conditions when light is incident on structures in which only a part (length: 20 μm) of the cladding layer 3030 having a thickness of 1,000 nm is thinned. Calculation was made assuming that light having a Gaussian intensity distribution is incident on the waveguiding layer from the right side in each drawing.

FIGS. 3A to 3D illustrate the calculated results when the thickness of the portion thinned in the cladding layer is 100 nm (FIG. 3A), 300 nm (FIG. 3B), 500 nm (FIG. 3C) or 1,000 nm (FIG. 3D; not thinned).

When the thickness of the cladding layer does not vary as in FIG. 3D, the light is confined in the waveguiding layer including the active layer, and does not leak on the substrate side. However, when a part of the cladding layer is thinned, the light causes coupling to leak to the substrate side. It can be confirmed that the light is more likely to couple as the cladding layer becomes thinner, and the quantity of light leaked to the substrate side increases (FIGS. 3A to 3C).

In order to achieve the effect of the present invention, it is important to allow the light to escape to the substrate side, and the structure of the cladding layer is not limited to a structure of projections and recesses like that illustrated in FIG. 1. For example, when the cladding layer is formed of different materials, even if the thickness of the cladding layer is constant, the same effect as in the case of the projected and recessed structure can be expected.

In other words, the light is confined in the waveguiding layer when the refractive index of the cladding layer is sufficiently small, while the light leaks to the substrate side when the refractive index of the cladding layer is great.

Thus, it is only necessary that the refractive index of a cladding layer portion located under a laser oscillation region (first region) is made relatively small, and the refractive index of a cladding layer portion located under any other region (second region) than the first region is made relatively great.

Alternatively, a structure in which the thickness and refractive index of the cladding layer are uniform and the optical waveguiding layer is modulated is also usable. For example, the light greatly leaks out to the side of the cladding layer as the thickness of the optical waveguiding layer becomes thin, so that the quantity of light emitted to the substrate side increases even when the structure of the cladding layer is fixed. In this case, a relatively thick portion of the optical waveguiding layer acts as the laser oscillation region (first region).

The same layer as that used in a general semiconductor laser may be used as the active layer 1020. Examples thereof include a multiple quantum well structure using a material such as GaAs/AlGaAs, GaInP/AlGaInP or GaN/InGaN.

The substrate 1040 is formed of, for example, GaAs, GaN, Si, SiC or sapphire. It is desirable that the substrate is formed of the same material as that forming the optical waveguiding layer or a material having a higher refractive index than that, for allowing the light to escape to the substrate side. The size of the respective two-dimensional photonic crystals and the arrangement pitch between them may be suitably determined as necessary for use of the resulting laser device. For example, the size of each two-dimensional photonic crystal is 5 μm square to 500 μm square, and the arrangement pitch between them is within a range of from 10 μm to 1 mm.

The surface emitting laser according to this embodiment can be driven according to a light excitation system or current injection system. Incidentally, electrodes are omitted in FIG. 1. A laser beam emission portion that is a laser emission portion is formed on the first region, and a laser beam is emitted in a direction perpendicular to the substrate from the emission portion.

EXAMPLES

The present invention will hereinafter be described by reference to the following Examples.

Example 1

An exemplary construction of a surface emitting laser according to this example is described with reference to FIG. 4.

Figure 4:
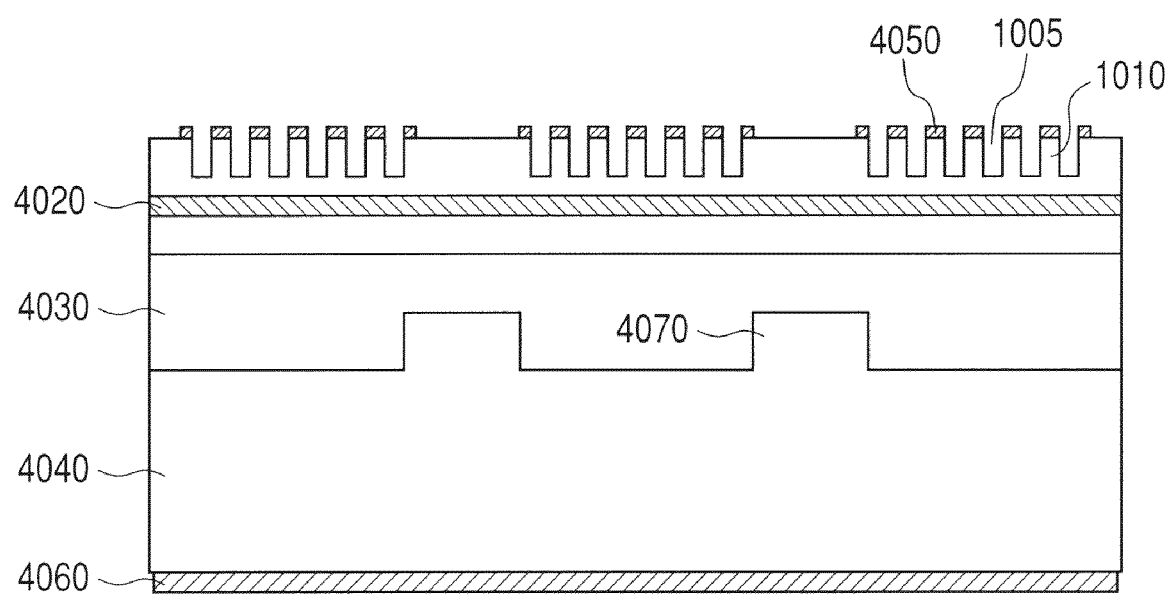
FIG. 4 illustrates a surface emitting laser according to Example 1 of the present invention.

In FIG. 4, two-dimensional photonic crystals 1010 are formed by providing holes 1005 in the form of a square lattice in p-type GaN that is a base material. In each two-dimensional photonic crystal, the lattice constant is 160 nm, the hole diameter is 70 nm, and the hole depth is 200 nm.

In FIG. 4, electrodes 4050 and 4060, an active layer 4020 formed of an $In_{0.09}Ga_{0.91}N/In_{0.02}Ga_{0.98}N$ multiple quantum well, an n-type cladding layer 4030 formed of $Al_{0.09}Ga_{0.91}N$ and a GaN substrate 4040 are illustrated.

The laser structure of this example is designed so as to generate laser oscillation at a wavelength of about 400 nm.

The size of the two-dimensional photonic crystal is 30 μm square, and the arrangement pitch between the two-dimensional photonic crystals is 50 p.m.

In FIG. 4, only three two-dimensional photonic crystals are illustrated. However, the crystals are actually arranged in the form of a two-dimensional array of 8 by 8.

Cladding layer portions of regions (first regions) located under the two-dimensional photonic crystals 1010 are different in thickness from cladding layer portions of other regions (second regions) than the first regions.

The thickness of the cladding layer in the first region is 1 μm, and the thickness of the cladding layer in the second region is 300 nm.

The sectional form of the cladding layer is a rectangular, recessed and projected shape as illustrated in FIG. 4.

In the surface emitting laser of this example, a plurality of the described first regions and second regions of such a rectangular, recessed and projected shape are provided, and the first regions are arranged in the form of a two-dimensional array through the second regions. The two-dimensional photonic crystals are separately formed over such first regions arranged in the form of the two-dimensional array.

According to the investigation by the present inventors, in the case of the above-described structure, light does not leak out to the substrate side because the cladding layer has a sufficient thickness so far as the thickness thereof is 1 μm, and the light couples on the substrate side when the thickness of the cladding layer is 300 nm because the thickness thereof is too thin, so that the mode is a substrate radiation mode.

As a result, the laser oscillation characteristics of the respective photonic crystal laser devices in the first regions are not affected, and in the second regions, crosstalk can be reduced by causing light going toward adjoining photonic crystal laser devices to escape to the substrate side.

Incidentally, in this example, the thickness of each device is sufficiently thin compared with the array pitch, and the electric conductivity of the p-type GaN is small, so that an insulation region for electrically insulating the respective laser devices is not particularly provided. However, an insulation region may also be provided by injecting an ion such as a proton to reduce the electric conductivity as needed.

Example 2

Figure 5A:
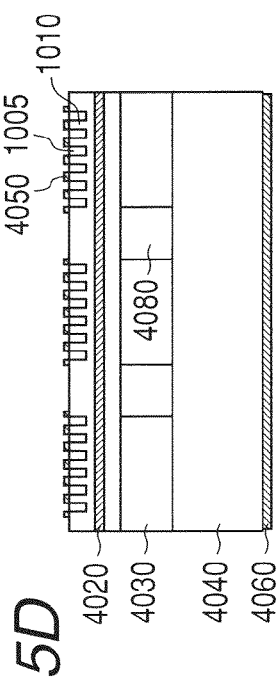
FIGS. 5A, 5B, 5C, 5D and 5E illustrate surface emitting lasers according to Examples 2 to 6 of the present invention, respectively.

A surface emitting laser array according to this example is described with reference to FIG. 5A.

This example is different from Example 1 only in that the two-dimensional photonic crystals are continuous rather than being separated from one another, and other details of the construction are the same as in Example 1.

In other words, the two-dimensional photonic crystals formed over the first regions are separated from one another and arranged in the form of the two-dimensional array in Example 1, while the photonic crystals are formed continuously over the first regions and second regions without being separated from one another.

In the thin regions (second regions) of the cladding layer, no laser oscillation occurs because light is emitted to the substrate side. Therefore, the respective laser devices can be separately driven like Example 1 even when the photonic crystals are continuous, so long as the photonic crystals are electrically insulated from one another.

A merit of this example superior to Example 1 is that production of the laser is easy because positioning between the projected and recessed portions of the cladding layer and the photonic crystals is not necessary.

Example 3

Figure 5B:
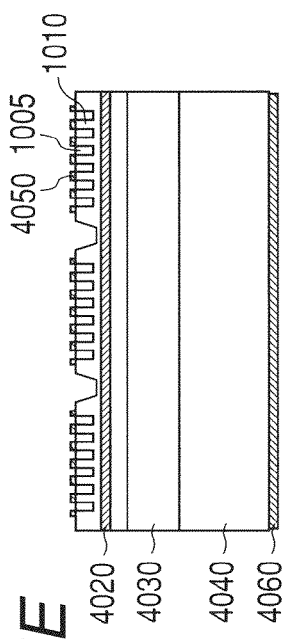

A surface emitting laser array in which the sectional form of a cladding layer formed is trapezoidal according to this example is described with reference to FIG. 5B.

This example is different from Example 1 in that the sectional form of a projected portion 4070 of the substrate is trapezoidal. Since the effective refractive index smoothly varies compared with the case where the sectional form of the cladding layer is in a rectangular, recessed and projected shape like Example 1, reflection of light on an interface between the first region and the second region can be further reduced. As a result, the influence of return light also can be further reduced.

Example 4

A surface emitting laser array according to this example is described with reference to FIG. 5C.

Figure 5C:
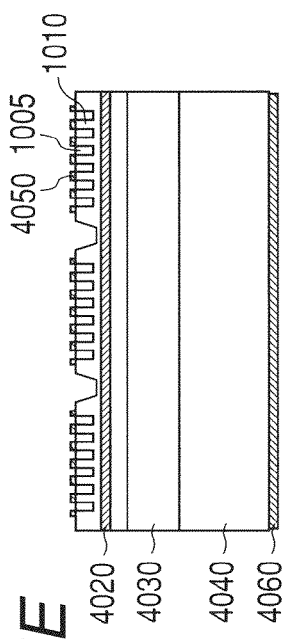

In this example, a cladding layer is formed with $In_{0.15}Ga_{0.85}N$, which is a light-absorbing material having a higher refractive index than GaN, provided in a second region indicated by 4070 in FIG. 5C. The other structural features are the same as in Example 1.

The influence of crosstalk and return light can be more reduced with absorbing light in the absorbing material.

Example 5

Figure 5D:
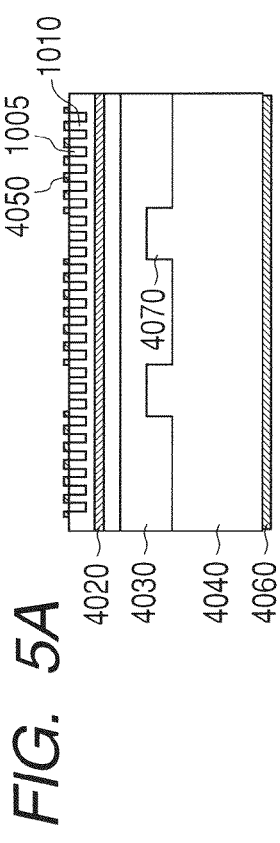

A surface emitting laser array according to this example is described with reference to FIG. 5D.

In this example, the thickness of a cladding layer is not varied, but the cladding layer is formed with various materials.

The cladding layer portions 4030 of the first regions are formed with $Al_{0.09}Ga_{0.91}N$, and the cladding layer portions 4080 of the second regions are formed with $Al_{0.04}Ga_{0.96}N$.

In the $Al_xGa_{1-x}N$ system, the refractive index becomes smaller as the Al component is increased, so that the refractive index of the cladding layer portions in the second regions is greater than that of the first regions. As a result, the intensity of light confinement in an optical waveguiding layer becomes weak even when the thickness of the cladding layer is constant, and so light leaks out to the substrate side, in a substrate radiation mode.

Example 6

Figure 5E:
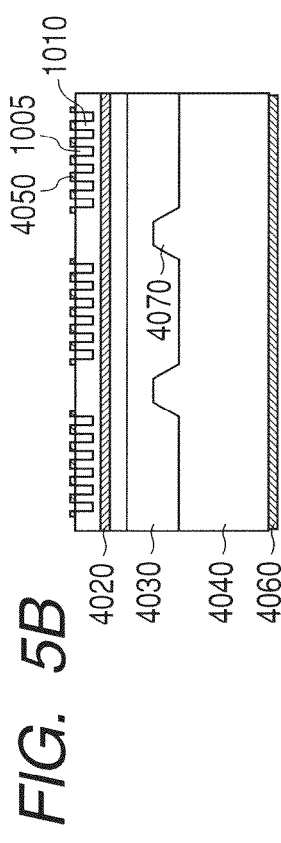
Figure 6:
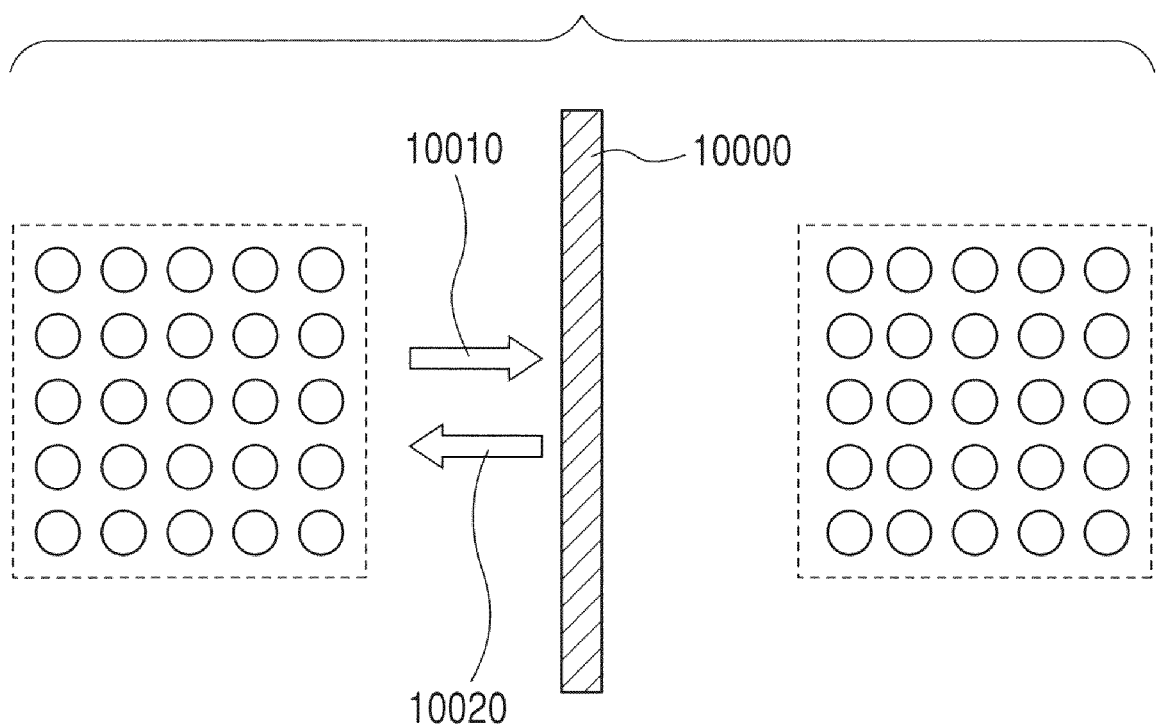
FIG. 6 illustrates return light when a reflection structure is provided between laser devices.

A surface emitting laser array according to this example is described with reference to FIG. 5E.

In this example, the thickness and refractive index of a cladding layer are uniform. Instead, the thickness of an optical waveguiding layer is modulated.

Specifically, the thickness of optical waveguiding layer portions in regions in which laser oscillation is not generated (second regions) becomes thin compared with the other regions (first regions). When the thickness of the optical waveguiding layer becomes thin, light greatly leaks out to the cladding layer. As a result, even when the composition and thickness of the cladding layer are uniform, the quantity of light leaked out to the substrate side increases to become a substrate radiation mode, so that crosstalk between laser devices can be reduced like the above-described Examples.

Although the respective Examples of the present invention have been described above, the surface emitting laser array according to the present invention is not limited to these Examples.

The form, material and size of the two-dimensional photonic crystal, and the materials forming the active layer, cladding layer and electrodes may be suitably changed within the scope of the present invention.

In the above-described Examples, the laser oscillation wavelength is 400 nm. However, oscillation can be made at any wavelength by selecting proper materials and structure.

Incidentally, the surface emitting laser arrays of the present invention described above can also be utilized as an array light source for conducting writing on a photosensitive drum of an image forming apparatus such as a copying machine or a laser printer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-090208, filed Apr. 2, 2009, which is hereby incorporated by reference herein in its entirety.

The invention claimed is:

1. A surface emitting laser comprising a laminated structure in which, on a substrate, a two-dimensional photonic crystal having a resonance mode in an in-plane direction of the substrate, an optical waveguiding layer, and a cladding layer for light confinement provided between the optical waveguiding layer and the substrate are laminated, wherein the laminated structure includes a first region having at least one guided mode as a propagation mode in which light is propagated in the in-plane direction at a laser oscillation wavelength and a second region having a substrate radiation mode in which light is emitted to a side of the substrate at the laser oscillation wavelength, wherein the first region includes the two-dimensional photonic crystal, wherein the cladding layer has an uneven thickness in an in-plane direction of the substrate, and wherein a first cladding layer portion included in the first region has a larger thickness than a second cladding layer portion included in the second region.

2. The surface emitting laser according to claim 1, wherein the second region does not include the two-dimensional photonic crystal.

3. The surface emitting laser according to claim 1, wherein the second region includes the two-dimensional photonic crystal.

4. The surface emitting laser according to claim 1, wherein a laser beam emission portion from which a laser beam is emitted is formed on the first region.

5. The surface emitting laser according to claim 1, wherein the cladding layer has a sectional form of a rectangle or a trapezoid.

6. The surface emitting laser according to claim 1, wherein a light absorbing material is provided in the second region.

7. A surface emitting laser array comprising a plurality of surface emitting lasers arranged in a two-dimensional array, wherein each surface emitting laser includes a laminated structure in which, on a substrate, a two-dimensional photonic crystal having a resonance mode in an in-plane direction of the substrate, an optical waveguiding layer, and a cladding layer for light confinement provided between the optical waveguiding layer and the substrate are laminated, wherein the laminated structure includes a first region having at least one guided mode as a propagation mode in which light is propagated in the in-plane direction at a laser oscillation wavelength and a second region having a substrate radiation mode in which light is emitted to a side of the substrate at the laser oscillation wavelength, and wherein the first region includes the two-dimensional photonic crystal, wherein the cladding layer has an uneven thickness in an in-plane direction of the substrate, and wherein a first cladding layer portion included in the first region has a larger thickness than a second cladding layer portion included in the second region.

* * * * *